(12) United States Patent
Koh et al.

(10) Patent No.: US 10,438,810 B2
(45) Date of Patent: Oct. 8, 2019

(54) METHOD OF FORMING PHOTORESIST PATTERN AND METHOD OF FABRICATING SEMICONDUCTOR DEVICE USING THE SAME

(71) Applicant: Samsung Electronics Co., Ltd., Suwon-si, Gyeonggi-do (KR)

(72) Inventors: Cha-Won Koh, Yongin-si (KR); Cheol-Hong Park, Seoul (KR); Hyun-Woo Kim, Seongnam-si (KR); Jin-Kyu Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/243,128

(22) Filed: Aug. 22, 2016

(65) Prior Publication Data

US 2017/0125257 A1    May 4, 2017

(30) Foreign Application Priority Data

Nov. 3, 2015 (KR) ........................ 10-2015-0153703

(51) Int. Cl.
*H01L 21/308* (2006.01)
*B81C 1/00* (2006.01)
*H01L 21/02* (2006.01)

(52) U.S. Cl.
CPC ...... *H01L 21/3088* (2013.01); *H01L 21/3085* (2013.01); *H01L 21/3086* (2013.01); *B81C 1/00952* (2013.01); *H01L 21/02052* (2013.01)

(58) Field of Classification Search
CPC ............ H01L 21/3088; H01L 21/3085; H01L 21/3086; H01L 21/02052; B81C 1/00952
See application file for complete search history.

(56) References Cited

U.S. PATENT DOCUMENTS

| | | | |
|---|---|---|---|
| 7,119,025 B2 * | 10/2006 | Daley | H01L 21/0335 438/725 |
| 7,214,474 B2 | 5/2007 | Deng | |
| 8,956,981 B2 | 2/2015 | Daley et al. | |
| 2006/0040216 A1 | 2/2006 | Lee | |

(Continued)

FOREIGN PATENT DOCUMENTS

| | | |
|---|---|---|
| JP | 07-142349 | 6/1995 |
| JP | 07-335519 | 12/1995 |

(Continued)

*Primary Examiner* — Anita K Alanko
(74) *Attorney, Agent, or Firm* — Harness, Dickey & Pierce, P.L.C.

(57) ABSTRACT

Example embodiments relate to a method of forming a photoresist pattern and a method of fabricating a semiconductor device using the same. The method of fabricating a semiconductor device comprises forming a mask layer on a substrate, forming a photoresist pattern on the mask layer, the photoresist pattern having pattern portions at a first height and recess portions, applying a first liquid onto the photoresist pattern, filling the recess portions with a pattern filler at a second height, the pattern filler having an higher etch rate than the etch rate of the pattern portions to the same etchant, removing the first liquid, etching the pattern filler after removing the first liquid, etching the mask layer via the photoresist pattern to form a mask pattern, and etching the substrate via the mask pattern to form a fine pattern.

13 Claims, 12 Drawing Sheets

(56) References Cited

U.S. PATENT DOCUMENTS

| | | | |
|---|---|---|---|
| 2010/0278922 A1* | 11/2010 | Vol | A61K 38/23 |
| | | | 424/489 |
| 2011/0061908 A1* | 3/2011 | Goto | H01L 51/442 |
| | | | 174/257 |
| 2011/0111604 A1 | 5/2011 | Kim et al. | |

FOREIGN PATENT DOCUMENTS

| | | |
|---|---|---|
| JP | 2003-142368 A | 5/2003 |
| JP | 2013-021152 A | 1/2013 |
| KR | 0269616 | 12/2000 |

* cited by examiner (a)            (b)            (c)

METHOD OF FORMING PHOTORESIST PATTERN AND METHOD OF FABRICATING SEMICONDUCTOR DEVICE USING THE SAME

The present application claims under 35 U.S.C. 119 priority to and the benefit of Korean Patent Application No, 10-2015-0153703 filed on Nov. 3, 2015 in the Korean Intellectual Property Office, the disclosure of which is incorporated herein in its entirety by reference.

BACKGROUND

1. Technical Field

Example embodiments relate to a method of forming a photoresist pattern and/or a method of fabricating a semiconductor device using the same.

2. Description of the Related Art

As information media rapidly develops, the capability of semiconductor devices increases as well. Recent semiconductor devices are typically highly integrated for low cost and high quality to increase competitiveness. For high integration, the scale of semiconductor devices becomes ever smaller.

As the integration degree of semiconductor devices increases, the design rules of various components in semiconductor devices continue to decrease. In order to fabricate a semiconductor device having a fine pattern to meet the trend toward highly integrated semiconductor devices, it is advantageous to implement patterns having a fine line width beyond the resolution limit of a photolithography apparatus.

To implement a semiconductor patterns having a fine line width, it is also advantageous to implement a photoresist layer as a photoresist pattern having a fine line width. To this end, it is advantageous to substantially prevent the photoresist pattern from lifting, and to improve line edge roughness and line width roughness of the pattern.

SUMMARY

Example embodiments relate to a method of fabricating a semiconductor device with improved reliability.

Example embodiments relate to a method of fabricating a semiconductor device including forming a semiconductor pattern having a uniform and fine line width.

Example embodiments relate to providing a method of forming a photoresist pattern having a uniform and fine line width.

Example embodiments relate to a method of forming a photoresist pattern by which the pattern is refrained from collapsing during a process of forming the pattern, and a method of fabricating a semiconductor device using the same.

This and other example embodiments and advantages will become immediately apparent to those of ordinary skill in the art upon review of the Detailed Description and claims to follow.

Example embodiments relate to a method of fabricating a semiconductor device, the method includes forming a mask layer on a substrate, forming a photoresist pattern on the mask layer, the photoresist pattern having pattern portions at a first height and recess portions, applying a first liquid onto the photoresist pattern, filling the recess portions with a pattern filler at a second height, the pattern filler having an higher etch rate than the etch rate of the pattern portions to the same etchant, removing the first liquid, etching the pattern filler after removing the first liquid, etching the mask layer via the photoresist pattern to form a mask pattern and etching the substrate via the mask pattern to form a fine pattern.

In some example embodiments, the first height is larger than the second height, and the etch rate of the pattern filler is smaller as a difference between the first height and the second height is larger.

In some example embodiments, the etching the pattern filler comprises at least partially etching the pattern portions so that the pattern portions have a third height that is lower than the first height by a first difference, and the etch rate of the pattern filler is larger as a difference between the first difference and the second height is larger.

In some example embodiments, the second height is about 30% of the first height or greater.

In some example embodiments, the etch rate of the pattern filler is about 150% of the etch rate of the pattern portions or greater.

In some example embodiments, the pattern filler contains oxygen atoms, and includes a material having an Ohnishi parameter of about 4 or greater.

In some example embodiments, the pattern filler includes at least one of a dextrin material, a dextrin derivative material and a polyester-based material.

In some example embodiments, the etching of the pattern filler comprises etching the pattern filler via a dry etching process.

Example embodiments relate to a method of fabricating a semiconductor device that includes forming a photoresist pattern on a mask layer, the photoresist pattern having pattern portions at a first height and recess portions, applying a first liquid onto the photoresist pattern, filling the recess portions with a pattern filler at a second height, the pattern filler having an higher etch rate than the etch rate of the pattern portions with respect to the same etchant, removing the first liquid, and after removing the first liquid, etching the pattern filler to form the photoresist pattern such that the pattern portions is at least partially etched so that the pattern portions have a third height that is lower than the first height by a first difference.

In some example embodiments, the first height is larger than the second height, and the etch rate of the pattern filler is smaller as a difference between the first height and the second height is larger.

In some example embodiments, the etch rate of the pattern filler is larger as a difference between the first difference and the second height is larger.

In some example embodiments, the second height is about 30% of the first height or greater.

In some example embodiments, the etch rate of the pattern filler is about 150% of the etch rate of the pattern portions or greater.

In some example embodiments, the pattern filler contains oxygen atoms, and includes a material having an Ohnishi parameter of about 4 or greater.

In some example embodiments, the pattern filler includes at least one of a dextrin material, a dextrin derivative material and a polyester-based material.

Example embodiments relate to a method of reducing or preventing deterioration of a photoresist pattern during a manufacturing process thereof, the method including forming the photoresist pattern on a mask layer, and at least one recessed portion adjacent to the at least one pattern portion, the photoresist pattern having at least one pattern portion having a first height, adding a pattern filler to the at least one recessed portion up to a second height, the second height being lower than the first height and greater than a threshold height, and removing the pattern filler.

BRIEF DESCRIPTION OF THE DRAWINGS

The above and other example embodiments will become more apparent with reference to the attached drawings, in which.

DETAILED DESCRIPTION OF THE EMBODIMENTS

Figure 1:
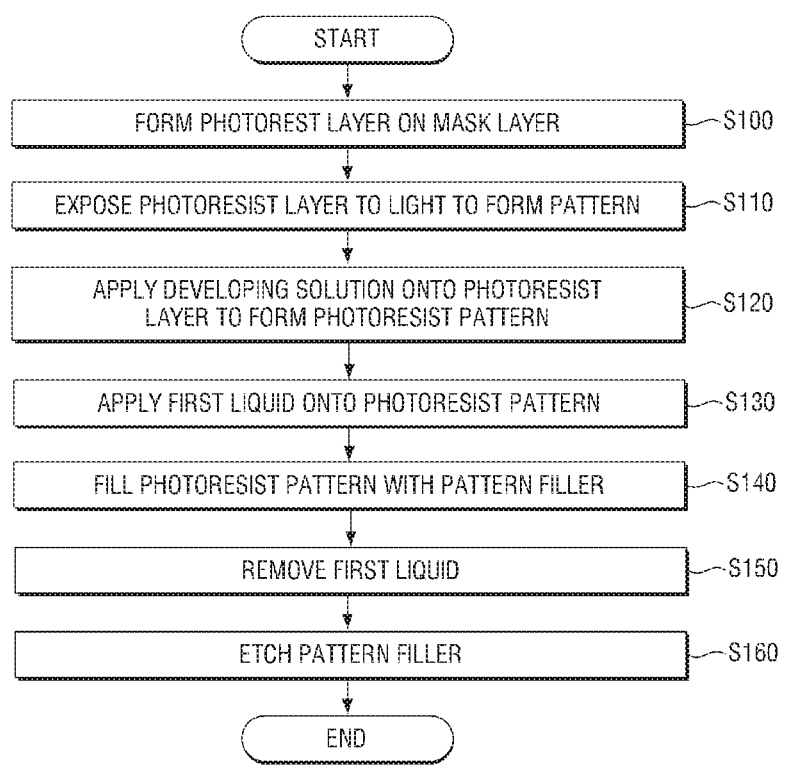
FIG. 1 is a flow chart for illustrating a method of forming a photoresist pattern according to some example embodiments.

Advantages and features of the inventive concepts and methods of accomplishing the same may be understood more readily by reference to the following detailed description of example embodiments and the accompanying drawings. The inventive concepts may, however, be embodied in many different forms and should not be construed as being limited to the example embodiments set forth herein. Rather, these example embodiments are provided so that this disclosure will be thorough and complete and will fully convey the concepts of the disclosure to those skilled in the art; and the inventive concepts will only be defined by the appended claims. In the drawings, the thickness of layers and regions are exaggerated for clarity.

It will be understood that when an element or layer is referred to as being "on," "connected to," or "coupled to" another element or layer, it can be directly on, directly connected to or coupled to another element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. In addition, it will also be understood that when a layer is referred to as being "between" two layers, it can be the on layer between the two layers, or one or more intervening layers may also be present.

It will be understood that, although the terms first, second, and the like, may be used herein to describe various elements, components, regions, layers and/or sections, these elements, components, regions, layers and/or sections should not be limited by these terms. These terms are only used to distinguish one element, component, region, layer and/or section from another element, component, region, layer and/or section. Thus, for example, a first element, a first component or a first section discussed below could be termed a second element, a second component or a second section without departing from the teachings of the present inventive concepts.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

The use of the terms "a" and "an" and the and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concepts belong. It is noted that the use of any and all examples, or example terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Hereinafter, a method of forming a photoresist pattern according to some example embodiments will be described with reference to FIGS. 1 to 12.

Figure 10:
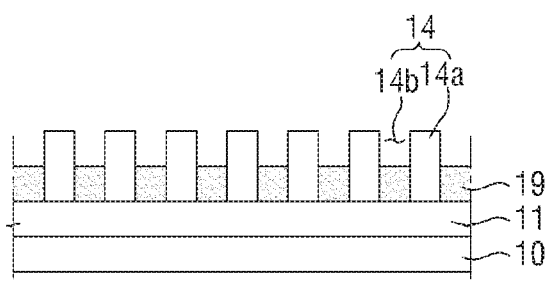
Figure 11:
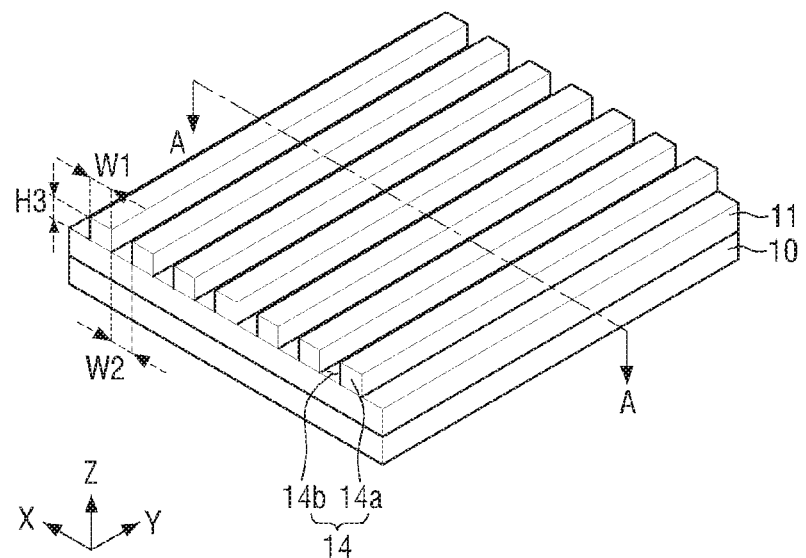
Figure 12:
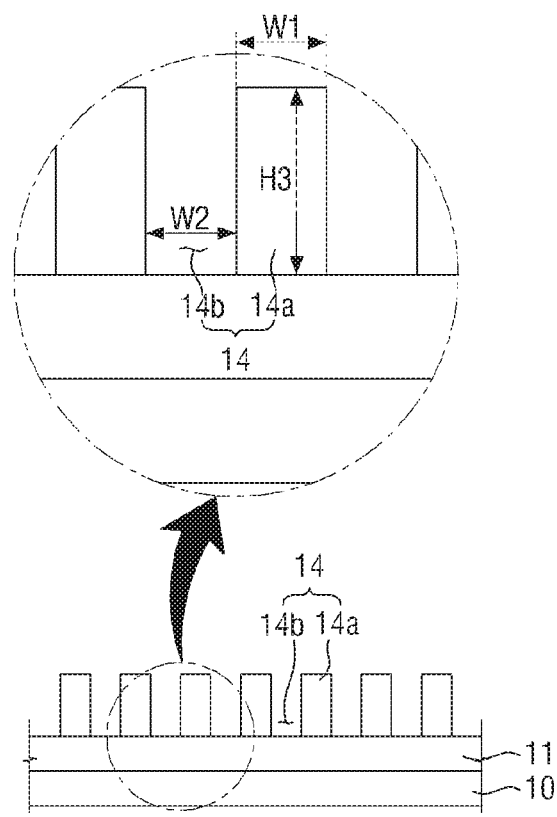

FIG. 1 is a flow chart for illustrating a method of forming a photoresist pattern according to some example embodiments. FIGS. 2 to 12 are views for illustrating processing steps of a method of forming a photoresist pattern according to some example embodiments. FIGS. 2 to 10 are cross-sectional views, FIG. 11 is a perspective view, and FIG. 12 is a cross-sectional view taken along line A-A' of FIG. 11.

Referring to FIG. 1, a method of forming a photoresist according to some example embodiments includes forming a photoresist layer on a mask layer (step S100), exposing the photoresist layer to light to form a pattern (step S110), applying a developing solution onto the photoresist layer to form a photoresist pattern (step S120), applying a first liquid on the photoresist pattern (step S130), filling the photoresist pattern with a pattern filler (step S140), removing the first liquid (step S150), and etching the pattern filler (step S160).

Figure 2:
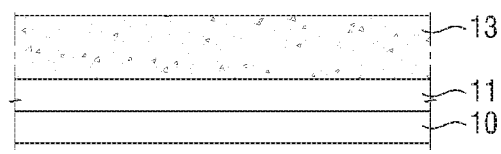
FIGS. 2 to 12 are views for illustrating processing steps of a method of forming a photoresist pattern according to some example embodiments.

Referring to FIGS. 1 and 2, a photoresist layer is formed on a mask layer (step S100).

The mask layer 11 may be made of, but is not limited to, a material including at least one of a silicon oxide film, a silicon nitride film and a silicon oxynitride. The mask layer 11 may be formed on a substrate 10. The mask layer 11 may be made of or include a material having an etch selectivity that is different from the etch sensitivity of the substrate 10.

The photoresist layer 13 may be made by, e.g., chemical vapor deposition, spin coating, plasma enhanced CVD (PECVD), high density plasma CVD (HDP-CVD), etc.

The thickness of the photoresist layer 13 on the mask layer 11 may range from about 30 to about 60 nm. For example, the thickness of the photoresist layer 13 on the mask layer 11 may be about 50 nm. The thickness of the photoresist layer 13 may be determined taking into account the size of a target pattern.

According to an example embodiment, a part of the pattern formed as the photoresist layer 13 may be removed during a subsequent process of removing a pattern filler. Accordingly, the thickness of the photoresist layer 13 may be determined taking into account the removed part of the pattern.

When a spin coating process is used for forming the photoresist layer 13, photoresist is sprayed onto the mask layer 11 while the mask layer 11 is rotating at a low speed, and then the mask layer 11 is accelerated up to a desired, or alternatively predetermined rotation speed so that it rotates at a high speed, thereby adjusting the thickness of the photoresist layer 13 to a desired thickness. Once the photoresist layer 13 reaches a desired thickness, the mask layer is decelerated to a low speed, to remove residuals.

A chemical treatment may be performed on the surface of the mask layer 11 or the substrate 10 before forming the photoresist layer 13, in order to enhance adhesion with the photoresist layer 13. The chemical treatment may be or include, hexamethyldisilazane (HMDS) treatment, for example. If the surface of the mask layer 11 or the substrate 10 is hydrophilic, the surface may be changed to be hydrophobic via the chemical treatment, so as to enhance the adhesion with the photoresist layer 13.

Figure 3:
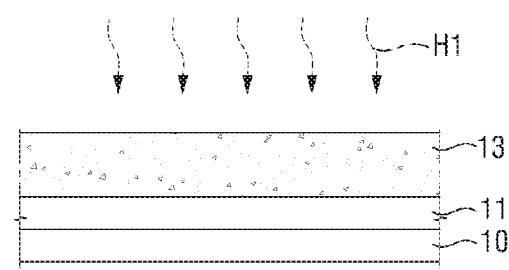

Referring to FIG. 3, a first baking process may be performed.

In the first baking process H1, the photoresist layer 13 applied on the mask layer 11 is heated, so that a solvent contained in the photoresist layer 13 may be removed.

For example, the first baking process H1 may be performed at a temperature between about 50° C. and about 250° C. for about 30 to about 180 seconds, so that a solvent contained in the photoresist layer 13 may be removed. The density of the photoresist layer 13 can be increased via the first baking process H1 to thereby reduce the sensitivity to the environmental change. In addition, contamination of the exposure equipment and the mask due to residual organic solvents can be reduced or substantially prevented, and the light-sensitive characteristics of the photoresist layer 13 can be maintained substantially constant.

Figure 4:
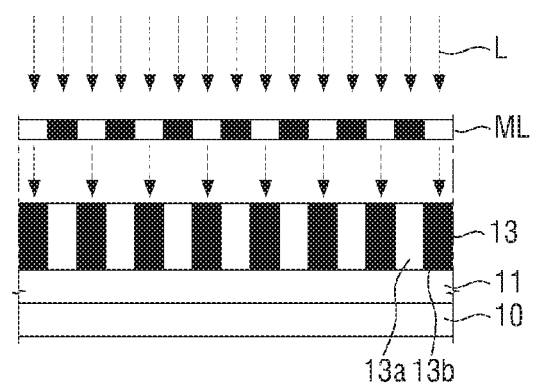

Referring to FIGS. 1 and 4, the photoresist layer is exposed to light to thereby form patterns (step S110).

Specifically, a photomask ML for forming patterns on the photoresist layer 13 is placed, and light L is subsequently irradiated thereon to form first and second patterns 13a and 13b.

The first pattern 13a may be formed where the light L is not irradiated, whereas the second pattern 13b may be formed where the light L is irradiated. If the photoresist layer 13 is a positive photoresist, a chemical reaction takes place in the area where the light L is irradiated, so that the area is removed by a developing solution. If the photoresist layer 13 is a negative photoresist, the area where the light L is not irradiated is removed by a developing solution.

Although the photoresist layer 13 is a positive photoresist in this example embodiment, it is to be understood that the photoresist layer 13 is not limited to the positive photoresist.

In this example embodiment, the exposure process at this step may be an extreme ultraviolet (EUV) exposure process for forming a fine pattern, and may irradiate the light L using i-line, a krypton fluoride (KrF) laser, or an argon fluoride (ArF) laser, for example.

Although the exposure process is performed using the photo mask ML in this example embodiment, it is merely illustrative and is not limiting. For example, in an example embodiment, the exposure process may be performed without using the photo mask, i.e., a maskless exposure process.

Figure 5:
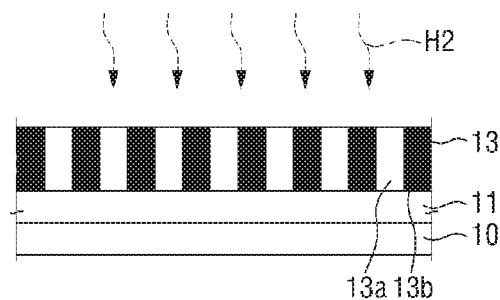

Referring to FIG. 5, a second baking process may be performed.

Via the baking process H2, the photoresist layer 13 may be dried. The second baking process H2 may be performed at a temperature between about 50° C. and about 250° C. for about 50 to about 250 seconds. However, this is merely illustrative and other temperature ranges and time ranges may be applicable.

Via the second baking process H2, chemical amplification may take place in the photoresist layer 13. If the photoresist layer 13 is an ArF photoresist using the wavelength of about 193 nm, the photoresist layer 13 may be a chemical amplified resist. In this case, the second baking process H2 may affect the sensitivity of the photoresist layer 13. However, it is merely illustrative.

Figure 6A:
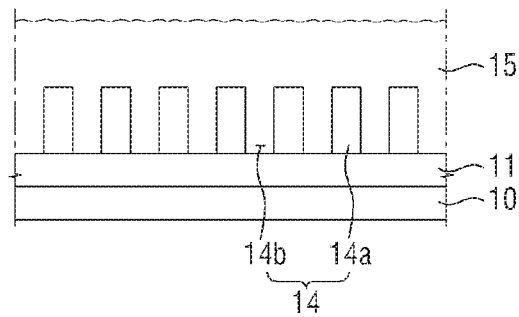
Figure 6B:
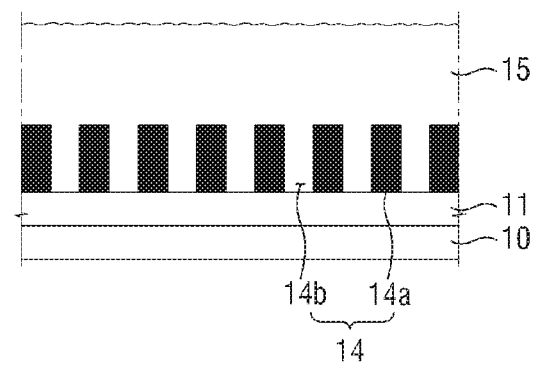

Referring to FIGS. 1, 6A and 6B, a developing solution may be applied onto the photoresist layer, thereby forming a photoresist pattern (step S120).

FIG. 6A shows a resulting photoresist pattern according to this example embodiment where the photoresist layer 13 is a positive photoresist. FIG. 6A shows a resulting photoresist pattern according to this example embodiment where the photoresist layer 13 is a negative photoresist.

The photoresist pattern 14 may include pattern portions 14a and recess portions 14b. As shown in FIG. 6A, if the photoresist layer 13 is a positive photoresist, the first pattern 13a (see FIG. 4) may become the pattern portions 14a, and the second pattern 13b (see FIG. 4) is removed such that the recess portions 14b may be formed.

Alternatively, as shown in FIG. 6B, if the photoresist layer 13 is a negative photoresist, the first pattern 13a (see FIG. 4) is removed such that the recess portions 14b may be formed, and the second pattern 13b (see FIG. 4) may become the pattern portions 14a.

If the photoresist layer 13 is a positive photoresist, the developing solution 15 may include, e.g., a water-soluble alkali solution such as tetramethyl-ammonium-hydroxide (TMAH) water solution.

If the photoresist layer 13 is a negative photoresist, the developing solution 15 may include, but is not limited to, e.g., n-BA(n-butyl acetate) or 2-heptanone.

The developing time with the developing solution 15 may be determined based on the thickness of the photoresist layer 11.

Figure 7:
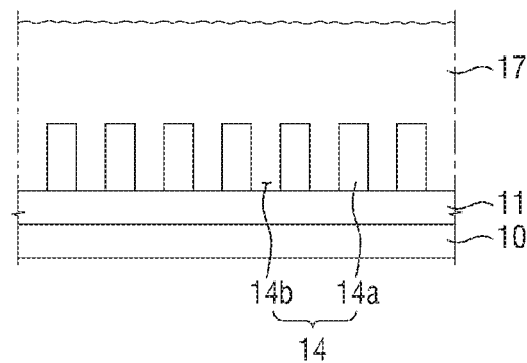

Referring to FIGS. 1 and 7, a first liquid is applied onto the photoresist pattern (step S130).

In at least one example embodiment, the first liquid 17 is applied onto the photoresist pattern 14 including the pattern portions 14a and the recess portions 14b, thereby removing impurities created during the process of developing with the developing solution 15. Accordingly, the first liquid 17 may be, but is not limited to, a cleaning solution.

In addition, the first liquid 17 may be a mixed solution of the cleaning solution and the developing solution 15. If the first liquid 17 is a cleaning solution, it may be, but is not limited to, e.g., deionized (DI) water or an organic solvent.

The type of the first liquid 17 is not particularly limited as long as it can generate surface tension with the side walls of the pattern portions 14a. A more detailed description thereof will be made below.

Subsequently, referring to FIGS. 1 and 8, the photoresist pattern is filled with a pattern filler (step S140).

Specifically, the recess portions 14b of the photoresist pattern 14 are filled with a pattern filler 19. Since the density of the pattern filler 19 is higher than the density of the first liquid 17, the first liquid 17 can float on the pattern filler 19. That is, by utilizing the difference in density, the recess portions 14b can be filled with the pattern filler 19 without removing the first liquid 17 in the recess portions 14b.

More detailed description thereof will be made with reference to an enlarged view showing region a circled by the dash-dot line.

Figure 8:
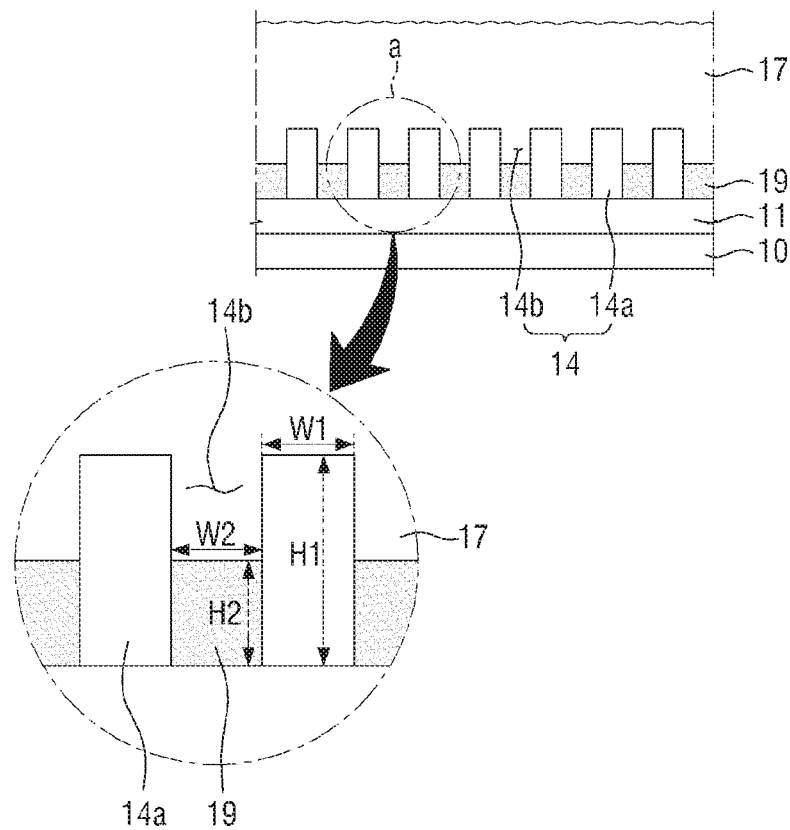

Referring to region "a" indicated by the dash-dot line in FIG. 8, a pattern portion 14a may have a first height H1 and a first width W1. The pattern filler 19, with which the recess portion 14b is filled, may have a second height H2 and a second width W2. Accordingly, the pattern filler 19 and the first liquid 17 may exist together in the recessed portion 14b. However, this is merely illustrative. For example, only the pattern filler 19 may exist in the recessed portion 14b.

According to an example embodiment, the recess portions 14b of the photoresist pattern 14 are filled with the pattern filler 19, so that it is possible to substantially prevent the pattern portions 14b from falling down and/or collapsing during the subsequent process of removing the first liquid 17.

In this regard, a more detailed description will be given with reference to FIGS. 9A and 9B.

Figure 9A:
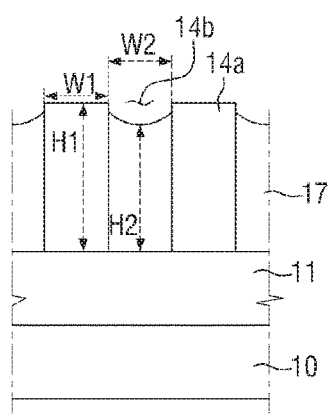

FIG. 9A is a cross-sectional view showing an example where no pattern filler exists in the recess portions 14b of the photoresist pattern 14. FIG. 9B is a set of cross-sectional views showing examples where the pattern filler 19 exists in the recess portions 14b at different heights.

The way in which the pattern portions 14b fall down and/or collapse by the first liquid 17 existing in the photoresist pattern 14 will be described with reference to FIG. 9A.

Referring to FIG. 9A, the first liquid 17 existing in a recess portion 14b may have a high surface tension on the interface with a pattern portion 14a. As a result, a force is created that pulls the pattern portions 14a laterally. For example, when the first liquid 17 is DI-water, the surface tension may be about 72 dyne/cm. When the first liquid 17 is an organic solvent, the surface tension may be about 30 dyne/cm.

Accordingly, capillary force is generated due to the surface tension of the first liquid 17 when the first liquid 17 is removed, and thus the pattern portion 14a is likely to collapse. The higher the height-to-width ratio of the pattern portion 14a is, the more likely to collapse the pattern portion 14a is.

In view of the above, according to an example embodiment, the recess portions 14b are filled with the pattern filler 19 to thereby reduce the capillary force, so that it is possible to substantially prevent the pattern portions 14a from collapsing.

Figure 9B:
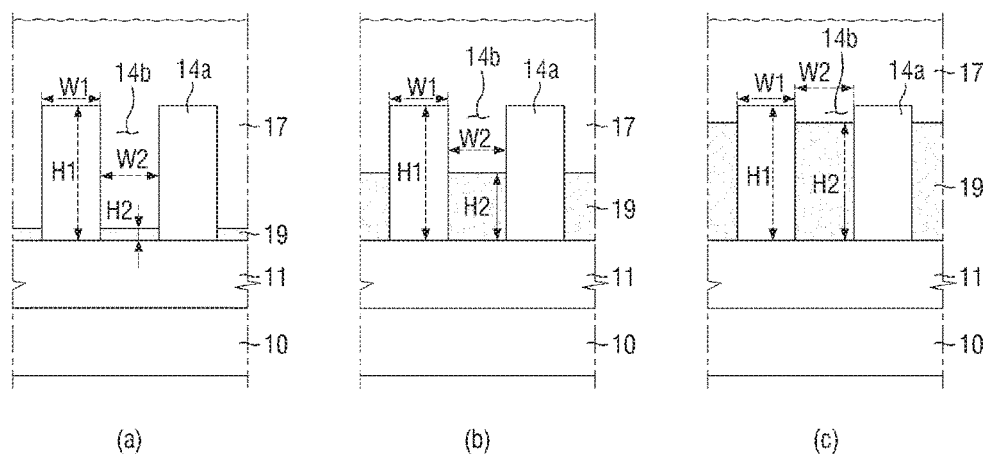

Referring to FIG. 9B, it can be seen that the height H2 of the pattern filler 19 differs in cases (a), (b) and (c). In cases (a), (b) and (c), the height-to-width ratio of the pattern portions 14a may be 2 or greater.

For case (a), the second height H2 may be about 10% of the first height H1 or less. In this case, it is somewhat possible to substantially prevent the pattern portions 14a from being lifted. However, the area of the interface between the pattern portions 14a and the first liquid 17 is still sufficiently large, so that it is difficult to substantially prevent the pattern portions 14a from collapsing due to the capillary force.

For cases (b) and (c), the second height H2 is about 30% of the first height H1 or greater. Accordingly, the area of the interface between the first liquid 17 and the pattern portions 14a is reduced, so that the capillary force can be reduced. As a result, it is possible to substantially prevent the pattern portions 14a from collapsing.

For example, for case (b), the first height H1 of the pattern portions 14a may be about 50 nm, and the second height H2 of the pattern filler 19 may be about 25 nm. In this case, the area of the interface between the first liquid 17 existing in the recess portions 14b and the pattern portions 14a is reduced by about 50% or more, compared to the area where no pattern filler exists, so that the capillary force can be reduced as well.

In this example embodiment, the second height H2 of the pattern filler 19 may be about 30% of the first height H1 or greater. In some cases, the recess portions 14b can be substantially filled with the pattern filler 19. Only if the second height H2 of the pattern filler 19 is at least about 30% of the first height H1, the surface tension of the first liquid 17 in contact with the pattern portions 14a can be reduced, and in turn the capillary force generated when the first liquid 17 is substantially removed can be reduced such that the pattern portions 14a can stand against the capillary force.

The etch rate of the pattern filler 19 may be higher than the etch rate of the pattern portions 14a with respect to the same etchant. Specifically, the etch rate of the pattern filler 19 may be about 150% of the etch rate of the pattern portions 14a with respect to the same etchant. In order to form a fine pattern using the photoresist pattern formed via the process of forming the photoresist pattern according to the example embodiment, the pattern filler 19 may be substantially removed. Accordingly, after the first liquid 17 is removed, the pattern filler 19 is no longer necessary and thus may be removed. Detailed description thereof will be made below with respect to removing the pattern filler 19.

Subsequently, referring to FIGS. 1 and 10, the first liquid in the photoresist pattern is removed.

The first liquid 17 covering the photoresist pattern 14 is removed, thereby exposing the upper surface of the pattern filler 19.

As described above, since the recess portions 14b of the photoresist pattern 14 are filled with the pattern filler 19, the pattern portions 14a of the photoresist pattern 14 do not collapse or fall down even after the first liquid 17 is removed. The first liquid 17 may be removed by, but is not limited to, spin dry.

The method of forming a photoresist pattern according to some example embodiments includes filling the recess portions 14b with the pattern filler 19, so that the area of the interface between the pattern portions 14a and the first liquid 17 is reduced with the surface tension. As a result, the capillary force due to the surface tension is reduced when the first liquid 17 is removed. Accordingly, it is possible to substantially prevent the pattern portions 14a of the photoresist pattern 14 from collapsing and/or falling down.

That is, in the method of forming a photoresist pattern according to some example embodiments, defects in the photoresist pattern are minimized, and thus it is possible to form a substantially uniform and fine semiconductor pattern in a subsequent process by using the photoresist pattern.

Subsequently, referring to FIGS. 1, 11 and 12, the pattern filler existing in the recess portions of the photoresist pattern is etched out and thus removed (step S160).

The pattern filler 19 existing in the recess portions 14b of the photoresist pattern 14 is removed, thereby completing the photoresist pattern 14.

The pattern filler 19 may be removed via, e.g., an etching process. The etching process may be a dry etch process. The dry etch process may use a fluorine gas as an etching gas. However, fluorine gas is merely illustrative and other gases may be used.

The pattern filler 19 and the pattern portions 14a may undergo the same etching process in a single chamber. Accordingly, the pattern filler 19 may include a material having a higher etch rate than the etch rate of the pattern portions 14a with respect to the same etchant. Specifically, the etch rate of the pattern filler 19 may be about 150% of the etch rate of the pattern portions 14a or greater.

Accordingly, when the etching process is carried out using the same etchant, the pattern filler 19 may be substantially removed while the pattern portions 14a are partially removed. It is to be noted that the pattern portions 14a is also partially removed and thus the height of the pattern portions 14a may be changed from the first height H1 to a third height H3 that is lower than the first height H1. The third height H3 may be the minimum height that allows the pattern portions 14a to work as a photoresist pattern. That is, the pattern portions 14a have to maintain at least the third height H3 in order to work as a photoresist pattern.

Hereinafter, more detailed description will be given in terms of numerical values. The numerical values given below are merely illustrative for facilitating understanding of the technical idea of the example embodiments, and thus are not intended to limit the technical idea of the example embodiments.

For example, the first height H1 of the pattern portions 14a may be about 50 nm, and the second height H2 of the pattern filler 19 may be about 15 nm. In this case, the second height H2 may be about 30% of the first height H1. If the etch rate of the pattern filler 19 is about 150% of the etch rate of the pattern portions 14a, the patterned filler 19 of about 15 nm can be substantially removed while the height of the pattern portions 14a is reduced by about 10 nm. In this case, the third height H3 of the pattern portions 14a after the pattern filler 19 is removed may be about 40 nm. For example, the first height H1 of the pattern portions 14a may be about 50 nm, and the second height H2 of the pattern filler 19 may be about 25 nm. In this case, the second height H2 may be about 50% of the first height H1. If the etch rate of the pattern filler 19 is about 250% of the etch rate of the pattern portions 14a, the patterned filler 19 can be substantially removed while the height of the pattern portions 14a is reduced by about 10 nm. In this case, the third height H3 of the pattern portions 14a may be about 40 nm after the pattern filler 19 is removed.

Accordingly, in this example embodiment, the etch rate of the pattern filler 19 may be relatively high when the difference between the first height H1 of the pattern portions 14a and the second height H2 of the pattern filler 19 is small, since a relatively large amount of pattern filler 19 has to be removed while a certain amount of the pattern portions 14a is removed.

On the other hand, the etch rate of the pattern filler 19 may be relatively low when the difference between the first height H1 of the pattern portions 14a and the second height H2 of the pattern filler 19 is large, since a relatively small amount of pattern filler 19 may be removed while the certain amount of the pattern portions 14a is removed. That is, the etch rate of the pattern filler 19 may be in inverse proportion to the difference between the first height H1 and the second height H2.

In this example embodiment, the pattern portions 14a may have the third height H3 of, for example, about 20 nm or higher.

As described above, the pattern portions 14a have the minimum height for a subsequent patterning process. Therefore, the etch rate of the pattern filler 19 may be in proportion to the difference between a first difference and the second height H2, wherein the first difference refers to the difference between the first height H1 and the third height H3.

For example, for the same height of the pattern filler 19, if the first difference is relatively large, the pattern filler 19 can be substantially removed even if the etch rate of the pattern filler 19 is low. On the other hand, if the first difference is relative small, the pattern filler 19 can be substantially removed only if the etch rate of the pattern filler 19 is relatively high.

Accordingly, when a part of the pattern portions 14a corresponding to the first difference H1-H3 and the pattern filler 19 of the second height H2 are removed for the same time period, in order to substantially remove the pattern filler 19 for the same time period, the etch rate of the pattern filler 19 has to be larger as the difference between the first difference and the second height H2 is larger.

The pattern filler 19 may contain oxygen atoms and may be or include a material having an Ohnishi parameter of about 4 or greater. A higher Ohnishi parameter typically indicates a higher etch rate of a material. In this example embodiment, the pattern filler 19 may be a material having an Ohnishi parameter of about 4 or greater.

In addition, the pattern filler 19 may be a dextrin material. For example, the dextrin material may be expressed in Formula 1 below:

[Chemical Formula 1]

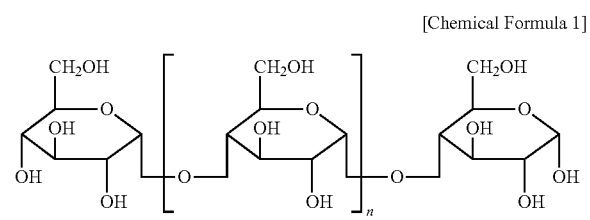

However, the above compound is merely illustrative.

In addition, the pattern filler 19 may be a dextrin derivative material. For example, the dextrin derivative material may be expressed in Formula 2 below:

[Chemical Formula 2]

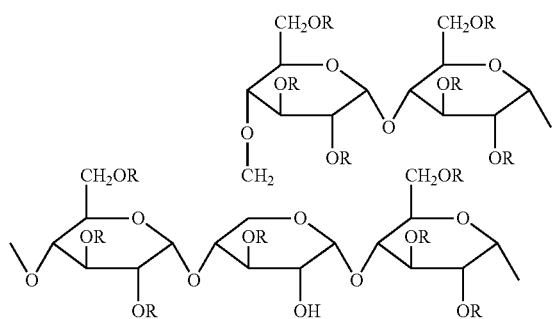

However, the above compound is merely illustrative.

As described above, in the method of forming a photoresist pattern according to some example embodiments, the recess portions 14b of the photoresist pattern 14 are filled with the pattern filler 19. Accordingly, it is possible to substantially prevent the pattern portions 14a from collapsing or falling down due to the capillary force generated when the first liquid 17 such as a cleaning solution and/or a developing solution is removed.

Accordingly, in the method of forming a photoresist pattern according to some example embodiments of the present disclosure, the photoresist pattern 14 with improved line edge roughness (LER) and line width roughness (LWR) can be formed, as shown in FIG. 11.

Figure 13:
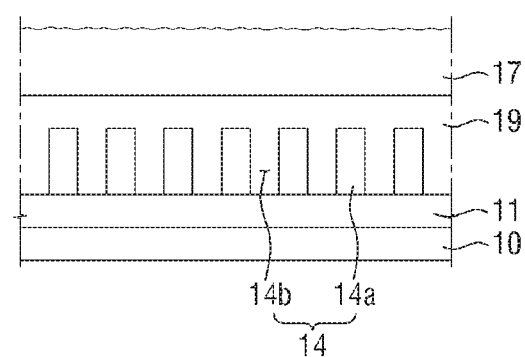
FIG. 13 is a cross-sectional view of a processing step of a method of forming a photoresist pattern according to some example embodiments.

FIG. 13 is a cross-sectional view of a processing step of a method of forming a photoresist pattern according to some example embodiments.

The method of forming a photoresist pattern according to this example embodiment is substantially identical to the method described above with respect to FIGS. 1 to 12, except for the processing step shown in FIG. 8. The processing step shown in FIG. 13 is the subsequent processing step to the processing step shown in FIG. 7. Like reference numerals used in FIGS. 1 to 12 denote like elements in FIG. 13, and descriptions of the identical elements will not be made to avoid redundancy.

Referring to FIG. 13, the pattern filler 19 may cover the photoresist pattern 14.

The photoresist pattern 14 may include pattern portions 14a and recess portions 14b. The recess portions 14b may be substantially filled with the pattern filler 19. The height of the pattern filler 19 may be larger than the height of the pattern portions 14b.

In this example embodiment, the density of the pattern filler 19 is higher than the density of the first liquid 17, and thus the pattern filler 19 can spread into the recess portions 14b. Accordingly, the first liquid 17 in the recess portions 14b can be substantially removed, and thus the capillary force generated when the first liquid 17 is removed in a subsequent process may not cause a problem. In this example embodiment, the etch rate of the pattern filler 19 may be larger than the etch rate of the pattern portions 14a.

Figure 14:
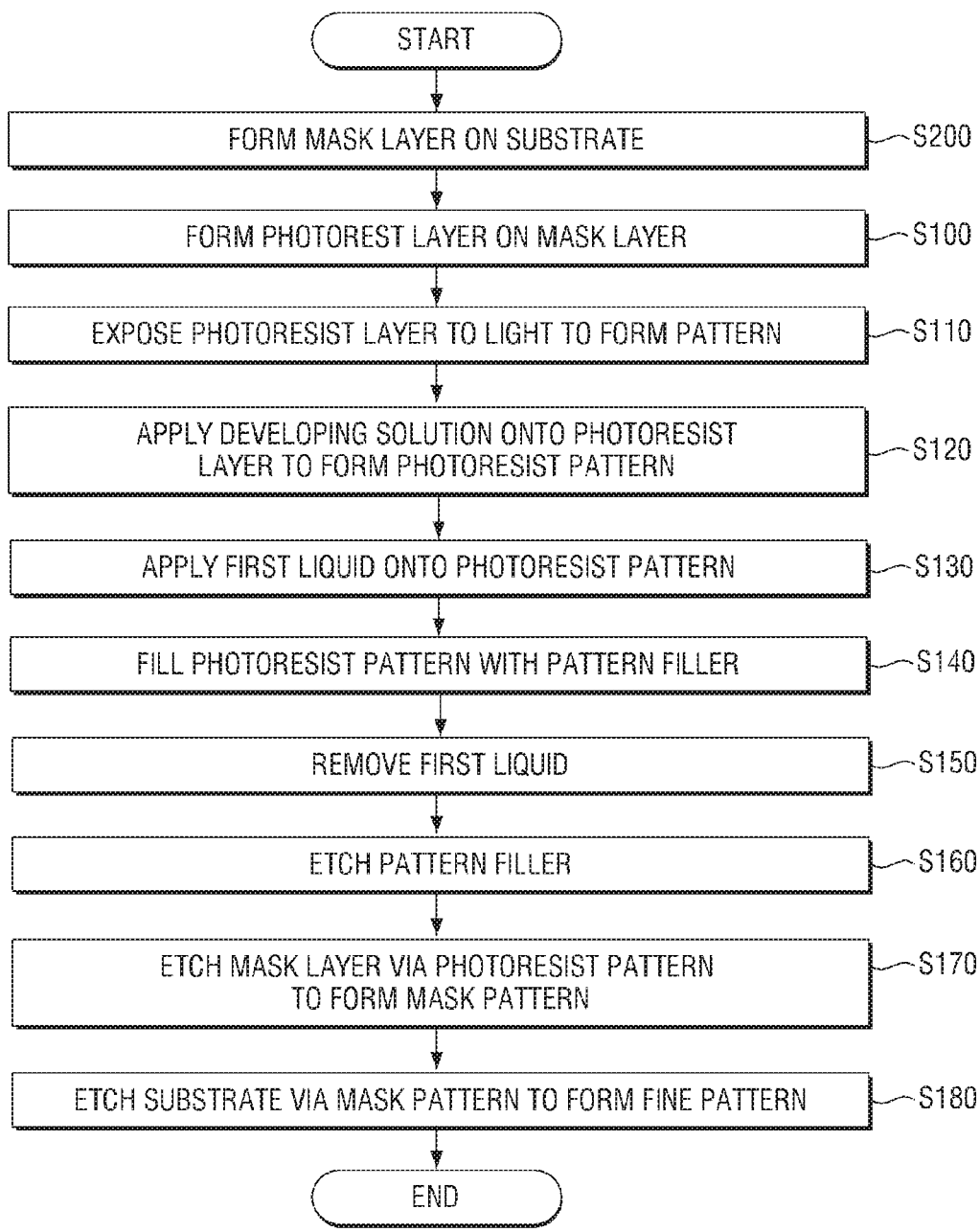
FIG. 14 is a flowchart for illustrating a method of fabricating a semiconductor device according to some example embodiments.

FIG. 14 is a flowchart for illustrating a method of fabricating a semiconductor device according to some example embodiments.

FIGS. 15 to 20 are cross-sectional views for illustrating processing steps of a method for fabricating a semiconductor device according to some example embodiments.

Referring to FIG. 14, the method includes forming a mask layer on a substrate (step S200), forming a photoresist layer on the mask layer (step S100), exposing the photoresist layer to light to form a pattern (step S110), applying a developing solution onto the photoresist layer to form a photoresist pattern (step S120), applying a first liquid on the photoresist pattern (step S130), filling the photoresist pattern with a pattern filler (step S140), removing the first liquid (step S150), etching the pattern filler (step S160), etching the mask layer via the photoresist pattern to form a mask pattern (step S170), and etching the substrate via the mask pattern to form a fine pattern (step S180).

The method of fabricating a semiconductor device according to some example embodiments includes the method of forming a photoresist pattern described above with respect to FIGS. 1 to 12. Accordingly, steps S100 to S160 according to this example embodiment are substantially identical to steps S100 to S160 of the method of forming a photoresist pattern described above with respect to FIGS. 1 to 12. Therefore, descriptions of the identical elements will not be made to avoid redundancy.

As an example of the method of fabricating a semiconductor device according to some example embodiments, the double patterning technology (DPT) process will be described. It is to be noted that the DPT process is merely an example and the method of forming a photoresist pattern described above with respect to FIGS. 1 to 12 is not limited thereto.

Referring to FIG. 14, a mask layer is formed on a substrate (S200).

The substrate may include a semiconductor material. The substrate may include at least one of Si, Ge, SiGe, GaP, GaAs, SiC, SiGeC, InAs and InP. Although the substrate includes a semiconductor material herein, the example embodiments are not limited thereto. The substrate may include any material as long as a fine pattern can be formed via etching.

Another target layer may or may not be formed on the substrate. That is, if the substrate itself is a target layer, another target layer may not be formed thereon.

The mask layer may be made of or include a material having an etch selectivity relative to the substrate. The mask layer may be one of silicon nitride, silicon oxide and silicon oxynitride. The mask layer may be formed by deposition via a PE-CVD process. The mask layer may be formed by using silicon-based spin-on hard mask (Si—SOH) such as spin-on glass (SOG).

Referring to FIG. 14, the example method includes forming a photoresist layer on a mask layer (step S100), exposing the photoresist layer to light to form a pattern (step S110), applying a developing solution onto the photoresist layer to form a photoresist pattern (step S120), applying a first liquid on the photoresist pattern (step S130), filling the photoresist pattern with a pattern filler (step S140), removing the first liquid (step S150), and etching the pattern filler (step S160). Steps S110 to S160 are substantially identical to those described above with reference to FIGS. 1 to 12, and thus will not be described to avoid redundancy.

Figure 15:
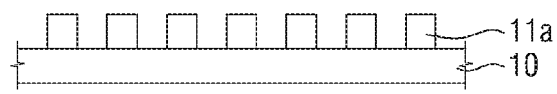
FIGS. 15 to 20 are cross-sectional views for illustrating processing steps of a method for fabricating a semiconductor device according to some example embodiments.

Referring to FIGS. 14 and 15, the mask layer is etched via the photoresist pattern, thereby forming a mask pattern (step S170).

The mask film 11 may be etched via the photoresist pattern 14, such that a mask pattern 11a may be formed.

Subsequently, referring to FIGS. 14 and 16 to 20, the substrate is etched via the mask pattern, thereby forming a fine pattern (step S180).

Figure 16:
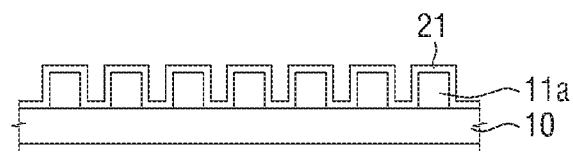

Referring to FIG. 16, a spacer film 21 may be formed on the mask pattern 11a.

The spacer film 21 may be formed along the mask pattern 11a such that it conforms to the mask pattern 11a, and may cover the upper surface and side walls of the mask pattern 11a.

The spacer film 21 may be made of or include a material having an etch selectivity relative to the mask pattern 11a. The spacer film 21 may include, but is not limited to, e.g., silicon oxide such as a medium temperature oxide (MTO), a high-temperature oxide (HTO) or an atomic layer deposition (ALD) oxide.

Figure 17:
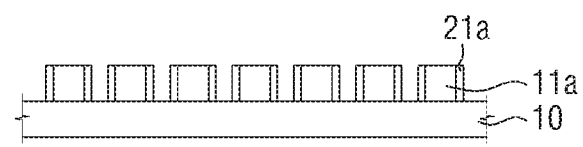

Subsequently, referring to FIG. 17, a part of the spacer film 21 is removed. A part of the spacer film 21 may be removed by using an etch back process. That is, a part of the spacer film 21 is removed by an etch back process to thereby form spacers 21a. By doing so, the upper surface of the mask pattern 11a may be exposed.

Figure 18:
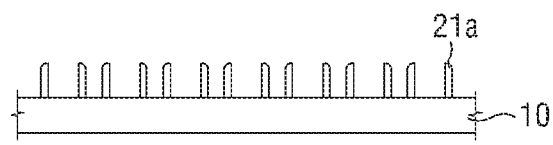

Subsequently, referring to FIG. 18, the mask layer 11a is removed.

By removing the mask layer 11a disposed between the spacers 21a, the upper surface of the substrate 10 may be exposed.

Figure 19:
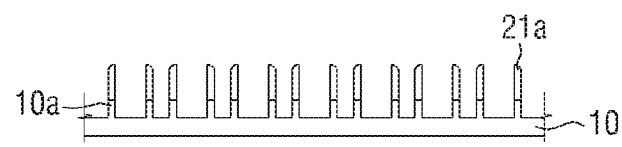
Figure 20:
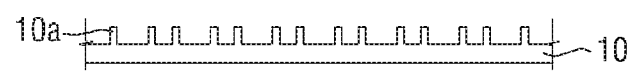

Subsequently, referring to FIGS. 19 and 20, the substrate 10 is etched using the spacers 21a as masks, thereby forming a fine pattern 10a. The fine pattern 10a may have, but is not limited to, a fin shape.

In the method of fabricating a semiconductor device according to some example embodiments, the fine pattern is formed by using the photoresist pattern produced by the above-described method of forming a photoresist pattern, so that the fine pattern is more uniform and has less defects.

Figure 21:
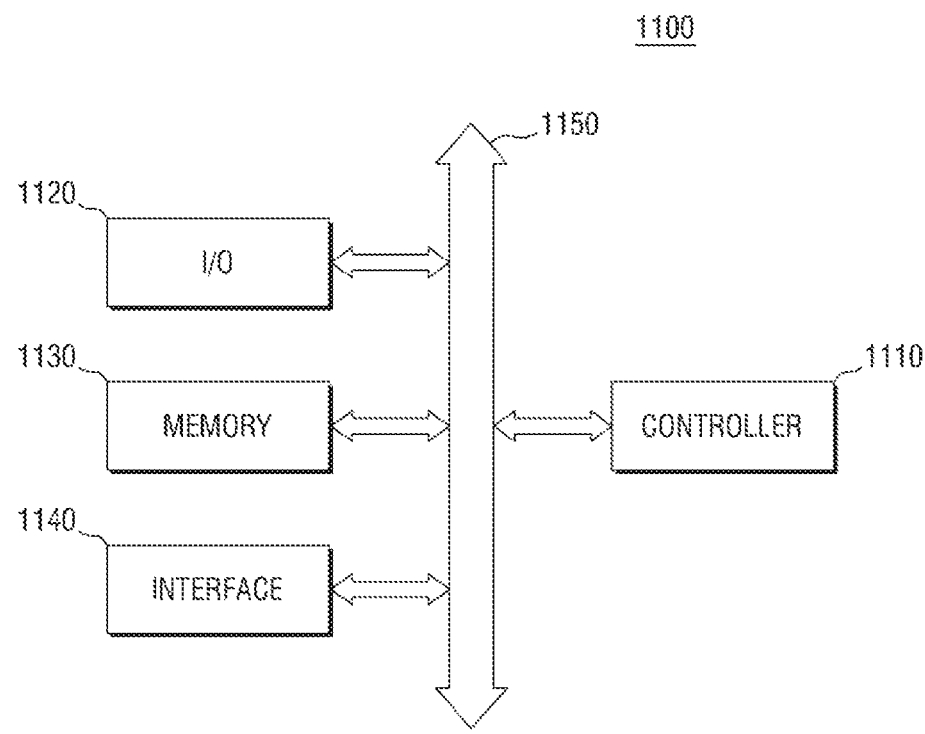
FIG. 21 is a block diagram of an electronic system including a semiconductor device according to some example embodiments.

FIG. 21 is a block diagram of an electronic system including a semiconductor device according to some example embodiments.

Referring to FIG. 21, the electronic system 1100 according to an example embodiment may include a controller 1110, an I/O (input/output) device 1120, a memory device 1130, an interface 1140 and a bus 1150. The controller 1110, the I/O device 1120, the memory device 1130 and/or the interface 1140 may be connected to one another via the bus 1150. The bus 1150 may serve as a path via which data is transferred.

The controller 1110 may include at least one of a microprocessor, a digital signal processor, a microcontroller and logic elements capable of performing similar functions. The I/O device 1120 may include a keypad, a keyboard, a display device, etc. The memory device 1130 may store therein data and/or instructions, for example. The interface 1140 may be capable of transmitting/receiving data to/from a communication network. The interface 1140 may be either a wired or wireless interface. For example, the interface 1140 may include an antenna, a wired/wireless transceiver or the like. Although not shown in FIG. 21, the electronic system 1100 may be an operational memory for improving the operation of the controller 1110 and may further include a high-speed DRAM and/or SRAM, for example. The semiconductor devices 1 to 11 according to some example embodiments may be provided in the memory device 1130 or may be provided as a part of the controller 1110, the I/O device 1120, for example.

The electronic system 11000 may be applied to a PDA (personal digital assistant portable computer, a web tablet, a wireless phone, a smart phone, a mobile phone, a digital music player, a memory card, or any electronic device capable of transmitting/receiving information in a wireless environment.

Figure 22:
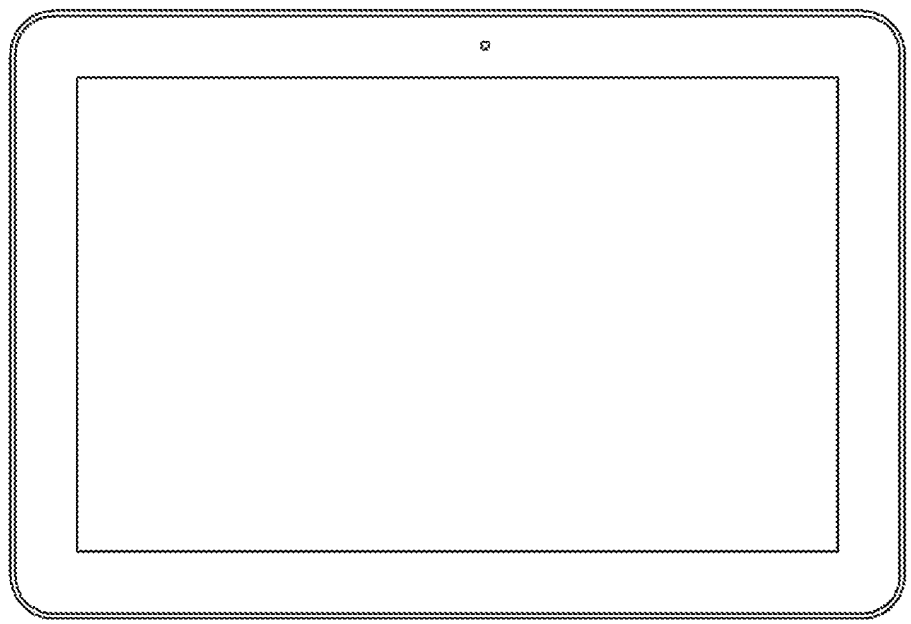
FIG. 22 shows an example of a semiconductor system that can employ the semiconductor devices fabricated according to some example embodiments.

FIG. 22 shows an example of a semiconductor system that can employ the semiconductor devices fabricated according to some example embodiments. FIG. 22 shows a tablet PC. The semiconductor devices fabricated according to some example embodiments may be used for a table PC, a laptop computer, etc. As will be appreciated by those skilled in the art, the semiconductor devices fabricated according to some example embodiments may be employed by other integrated circuit devices than those mentioned above.

Although the example embodiments discussed above have been described with reference to the accompanying drawings, those skilled in the art will readily appreciated that various modifications and alterations may be made without departing from the technical idea or essential features. Therefore, it should be understood that the above-mentioned embodiments are not limiting but illustrative in all example embodiments.

What is claimed is:

1. A method of fabricating a semiconductor device, the method comprising:
   forming a mask layer on a substrate;
   forming a photoresist pattern on the mask layer, the photoresist pattern having pattern portions and recess portions, the pattern portions having a first height;
   applying a first liquid onto the photoresist pattern;
   filling the recess portions with a pattern filler up to a second height after applying the first liquid by adding a pattern filler in the first liquid so that the first liquid floats on all the pattern filler, the pattern filler having a higher etch rate than an etch rate of the pattern portions, a density of the pattern filler being higher than a density of the first liquid;
   removing the first liquid after filling the recess portions with the pattern filler;
   etching the pattern filler;
   etching the mask layer via the photoresist pattern to form a mask pattern; and
   etching the substrate via the mask pattern to form a fine pattern;
   wherein the filling the recess portions with the pattern filler is performed without baking,
   wherein the etch rate of the pattern filler is at least about 150% of the etch rate of the pattern portions,
   wherein the pattern filler includes a material having an Ohnishi parameter of about 4 or greater, and
   wherein the pattern filler includes a dextrin material.

2. The method of claim 1, wherein
   the first height is greater than the second height, and
   the etch rate of the pattern filler decreases as a difference between the first height and the second height increases.

3. The method of claim 1, wherein the etching the pattern filler comprises:
   etching the pattern portions at least partially so that the pattern portions have a third height that is lower than the first height by a first difference, and the etch rate of the pattern filler increases as a difference between the first difference and the second height increases.

4. The method of claim 1, wherein the second height is at least about 30% of the first height.

5. The method of claim 1, wherein the etching the pattern filler comprises:
   etching the pattern filler via a dry etching process.

6. A method of forming a photoresist pattern, the method comprising:
   forming a photoresist pattern on a mask layer, the photoresist pattern having pattern portions and recess portions, the pattern portions having a first height;
   applying a first liquid onto the photoresist pattern;
   filling the recess portions with a pattern filler up to a second height after applying the first liquid by adding a pattern filler in the first liquid so that the first liquid floats on all the pattern filler, the pattern filler having a higher etch rate than an etch rate of the pattern portions, a density of the pattern filler being higher than a density of the first liquid;
   removing the first liquid after filling the recess portions with the pattern filler; and
   etching the pattern filler to form the photoresist pattern such that the pattern portions are at least partially etched to have a third height that is lower than the first height by a first difference;
   wherein the filling the recess portions with the pattern filler is performed without baking,
   wherein the etch rate of the pattern filler is at least about 150% of the etch rate of the pattern portions,
   wherein the pattern filler includes a material having an Ohnishi parameter of about 4 or greater, and
   wherein the pattern filler includes a dextrin material.

7. The method of claim 6, wherein
   the first height is greater than the second height, and
   the etch rate of the pattern filler decreases as a difference between the first height and the second height increases.

8. The method of claim 6, wherein the etch rate of the pattern filler increases as a difference between the first difference and the second height increases.

9. The method of claim 6, wherein the second height is at least about 30% of the first height.

10. A method, comprising:
    forming a photoresist pattern on a mask layer, the photoresist pattern having at least one pattern portion and at least one recessed portion adjacent to the at least one pattern portion, the at least one pattern portion having a first height;
    applying a first liquid onto the photoresist pattern;
    adding a pattern filler to the at least one recessed portion up to a second height after applying the first liquid by adding a pattern filler in the first liquid so that the first liquid floats on all the pattern filler, the second height being lower than the first height and greater than a threshold height, a density of the pattern filler being higher than a density of the first liquid;
    removing the first liquid after filling the at least one recessed portion with the pattern filler; and
    removing the pattern filler;
    wherein the adding the pattern filler to the at least one recessed portion is performed without baking,
    wherein the removing the pattern filler includes
      etching the pattern filler and the at least one pattern portion via an etchant, an etch rate of the pattern filler is at least about 150% an etch rate of the at least one pattern portion,
    wherein the pattern filler includes a material having an Ohnishi parameter of about 4 or greater, and
    the pattern filler includes a dextrin material.

11. The method of claim 10, wherein the threshold height is at least about 30% of the first height.

12. The method of claim 10, wherein the at least one pattern portion is at least partially etched to have a third height that is lower than the first height, the third height being a height of the photoresist pattern.

13. The method of claim 1, wherein the removing the first liquid is performed by spin drying the photoresist pattern.

* * * * *